(12) United States Patent  
Chu et al.

(10) Patent No.: US 8,225,067 B2  
(45) Date of Patent: Jul. 17, 2012

(54) MULTILEVEL CELL NAND FLASH MEMORY STORAGE SYSTEM, AND CONTROLLER AND ACCESS METHOD THEREOF

(75) Inventors: Chien-Hua Chu, Hsinchu County (TW); Chih-Kang Yeh, Kinmen County (TW); Kok-Yong Tan, Miaoli County (TW)

(73) Assignee: Phison Electronics Corp., Miaoli (TW)

( * ) Notice: Subject to any disclaimer, the term of this patent is extended or adjusted under 35 U.S.C. 154(b) by 600 days.

(21) Appl. No.: 12/413,071

(22) Filed: Mar. 27, 2009

(65) Prior Publication Data

US 2010/0205352 A1    Aug. 12, 2010

(30) Foreign Application Priority Data

Feb. 10, 2009    (TW) .............................. 98104176 A (51) Int. Cl.
 *G06F 12/00* (2006.01)
(52) U.S. Cl. ................. 711/202; 711/103; 711/E12.008
(58) Field of Classification Search .................. 711/103, 711/170, E12.001, 202, E12.008
 See application file for complete search history.

(56) References Cited

U.S. PATENT DOCUMENTS

| | | | |
|---|---|---|---|
| 7,962,685 B2 * | 6/2011 | Cheung et al. ................. | 711/103 |
| 2008/0104309 A1 * | 5/2008 | Cheon et al. ................... | 711/103 |
| 2009/0327590 A1 * | 12/2009 | Moshayedi ..................... | 711/103 |
| 2010/0023682 A1 * | 1/2010 | Lee et al. ....................... | 711/103 |
| 2010/0122016 A1 * | 5/2010 | Marotta et al. ................. | 711/103 |
| 2010/0205352 A1 * | 8/2010 | Chu et al. ....................... | 711/103 |

* cited by examiner

*Primary Examiner* — Pierre-Michel Bataille
(74) *Attorney, Agent, or Firm* — J.C. Patents (57) ABSTRACT

A multi level cell (MLC) NAND flash memory storage system is provided. A controller of the MLC NAND flash memory storage system declares it a signal level cell (SLC) NAND flash memory chip to a host system connected thereto and provides a plurality of SLC logical blocks to the host system. When the controller receives a write command and a user data from the host system, the controller writes the user data into a page of a MLC physical block and records the page of the SLC logical block corresponding to the page of the MLC physical block. When the controller receives an erase command from the host system, the controller writes a predetermined data into the page of the MLC physical block mapped to the SLC logical block to be erased, wherein the predetermined data has the same pattern as a pattern of the erased page.

32 Claims, 8 Drawing Sheets

| MLC physical block page index field | SLC logical block address field | SLC logical page address field |
|:---:|:---:|:---:|
| 0 | 310-1 | 0 |
| 1 | 310-2 | 0 |
| 2 | 310-1 | 1 |
| 3 | 310-1 | 2 |
| 4 | 310-2 | 1 |
| ⋮ | ⋮ | ⋮ |
| 127 | 310-2 | 63 |

| Lower page address | Upper page address |
|---|---|
| 0 | 4 |
| 1 | 5 |
| 2 | 8 |
| 3 | 9 |
| 6 | 12 |
| 7 | 13 |
| 10 | 16 |
| 11 | 17 |
| ⋮ | ⋮ |
| 110 | 116 |
| 111 | 117 |
| 114 | 120 |
| 115 | 121 |
| 118 | 124 |
| 119 | 125 |
| 122 | 126 |
| 123 | 127 |

MULTILEVEL CELL NAND FLASH MEMORY STORAGE SYSTEM, AND CONTROLLER AND ACCESS METHOD THEREOF

CROSS-REFERENCE TO RELATED APPLICATION

This application claims the priority benefit of Taiwan application serial no. 98104176, filed on Feb. 10, 2009. The entirety of the above-mentioned patent application is hereby incorporated by reference herein and made a part of specification.

BACKGROUND

1. Technology Field

The present invention generally relates to a flash memory storage system, and more particularly, to a multi level cell (MLC) NAND flash memory storage system simulated as a single level cell (SLC) NAND flash memory chip, a flash memory controller thereof, and an access method for simulating a MLC NAND flash memory chip into a SLC NAND flash memory chip.

2. Description of Related Art

The consumers' demand to storage media has increased drastically along with the widespread of digital cameras, camera phones, and MP3 in recently years. Flash memory is one of the most adaptable storage media for such battery-powered portable electronic products due to its characteristics such as data non-volatility, low power consumption, small volume, and non-mechanical structure. A memory card is a storage device using a NAND flash memory chip as its storage medium. Memory cards have been broadly adopted for storing personal data since they are small in volume, large in capacity, and convenient to be carried around. Thereby, flash memory has become one of the most focused electronic products in recent years.

Figure 1A:
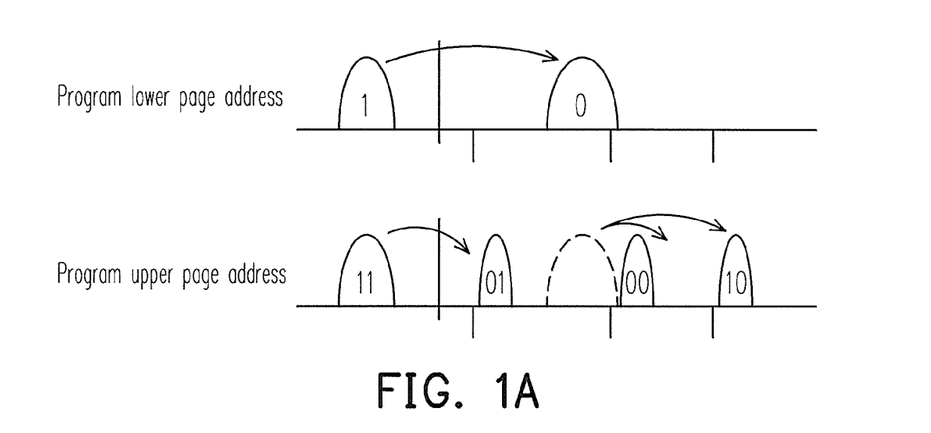
FIG. 1A and FIG. 1B are diagrams illustrating the programming and page disposition of a multi level cell (MLC) NAND flash memory according to a conventional technique.
Figure 1B:
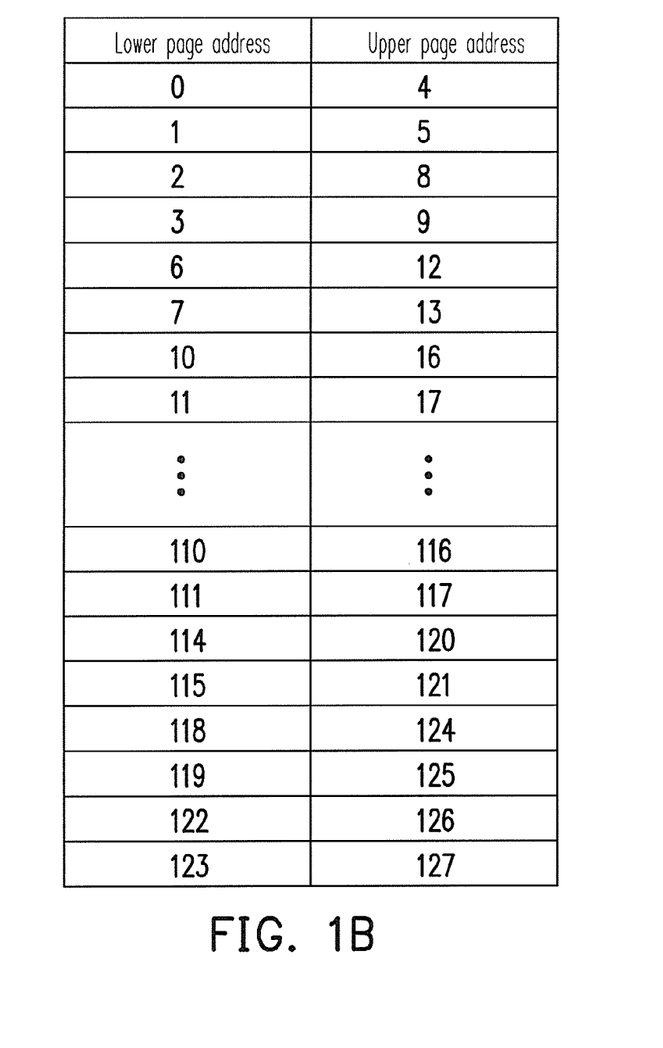

According to existing NAND flash memory techniques, NAND flash memories can be categorized into single level cell (SLC) NAND flash memories or multi level cell (MLC) NAND flash memories according to the number of data bits which can be stored in each memory cell. To be specific, only a single-stage programming can be performed to each memory cell in a SLC NAND flash memory, and accordingly each memory cell can only store one bit. Contrarily, each physical block in a MLC NAND flash memory is programmed in multiple stages. For example, taking a MLC NAND flash memory wherein each memory cell stores two data bits as an example, as shown in FIG. 1A, each physical block is programmed in two stages. The first stage is to write into a lower page, wherein the physical characteristic of the lower page is similar to that of a SLC NAND flash memory. After the first stage, an upper page is programmed, wherein the write speed of the lower page is faster than that of the upper page. Thereby, as shown in FIG. 1B, the page addresses in each physical block can be divided into slow pages (i.e., upper page addresses) and fast pages (i.e., lower page addresses). Similarly, in a MLC NAND flash memory wherein each memory cell can store multiple data bits, each memory cell contains more page addresses and is programmed in more stages. Because a MLC NAND flash memory can provide more storage space, in recent years, SLC NAND flash memories have been gradually replaced by MLC NAND flash memories for applying to memory modules (for example, memory cards) as storage media.

However, the physical characteristic of a MLC NAND flash memory is different from that of a SLC NAND flash memory. For example, every time when data is written into a page of a MLC NAND flash memory, the page can only be programmed once. Thus, the MLC NAND flash memory is programmed in unit of pages. However, the page can be programmed multiple times in a SLC NAND flash memory. For example, when a page of the SLC NAND flash memory has 4 sectors, data can be programmed in the SLC NAND flash memory in unit of sectors, so amount of data which be programmed in the SLC NAND flash memory may be less than a capacity of one page.

In addition, each memory cell in a MLC NAND flash memory can store multiple bits. Thus, the MLC NAND flash memory has lower stability than a SLC NAND flash memory, and accordingly the MLC NAND flash memory needs to be performed an error checking and correcting procedure with an error checking and correcting code capable of checking and correcting more bits.

Moreover, taking a MLC NAND flash memory wherein each memory cell stores two data bits as an example, each MLC block can be considered as two SLC blocks. However, data can only be written into a flash memory block according to the order of its pages. Thus, when each MLC block is considered as two SLC blocks, data cannot be written into the MLC block as it is alternatively written into two SLC blocks. Furthermore, data in a flash memory is erased in unit of blocks. Thus, when each MLC block is considered as two SLC blocks, two SLC blocks are erased together to erase a MLC block.

Accordingly, even though many memory modules with MLC NAND flash memory chips have been provided, a host system supporting only a SLC NAND flash memory chip cannot support a memory module having a MLC NAND flash memory chip.

SUMMARY

Accordingly, the present invention is directed to a multi level cell (MLC) NAND flash memory storage system which can be accessed through a method for accessing a single level cell (SLC) NAND flash memory chip.

The present invention is directed to a flash memory controller which can simulate a MLC NAND flash memory chip into a SLC NAND flash memory chip.

The present invention is directed to an access method which can simulate a MLC NAND flash memory chip into a SLC NAND flash memory chip.

The present invention provides a MLC NAND flash memory storage system for simulating a SLC NAND flash memory chip. The MLC NAND flash memory storage system includes a connector for connecting a host system, a MLC NAND flash memory chip, and a flash memory controller coupled to the MLC NAND flash memory chip and the connector, wherein the MLC NAND flash memory chip has a plurality of MLC physical blocks and each of the MLC physical blocks has a plurality of pages. The flash memory controller provides a plurality of SLC logical blocks corresponding to the SLC NAND flash memory chip to the host system, wherein each of the MLC physical blocks is mapped to at least two SLC logical blocks.

The present invention provides a flash memory controller suitable for simulating a MLC NAND flash memory chip into a SLC NAND flash memory chip, wherein the MLC NAND flash memory chip has a plurality of MLC physical blocks and each of the MLC physical blocks has a plurality of pages. The flash memory controller includes a microprocessor unit, a SLC block simulation unit, a first flash memory interface unit, and a second flash memory interface unit. The microprocessor unit is coupled to a first flash memory interface unit and a second flash memory interface unit. The SLC block simulation unit is coupled to the microprocessor unit and provides a plurality of SLC logical blocks corresponding to the SLC NAND flash memory chip to a host system, wherein each of the MLC physical blocks is mapped to at least two SLC logical blocks. The first flash memory interface unit receives a logical address and a command corresponding to the SLC logical blocks from the host system and provides the logical address and the command to the microprocessor unit. The second flash memory interface unit is used for coupling the MLC NAND flash memory chip.

The present invention provides an access method for simulating a MLC NAND flash memory chip into a SLC NAND flash memory chip. The access method includes providing the MLC NAND flash memory chip, wherein the MLC NAND flash memory chip has a plurality of MLC physical blocks and each of the MLC physical blocks has a plurality of pages. The access method also includes disposing a plurality of SLC logical blocks and recording the mapping relationship between the MLC physical blocks and the SLC logical blocks, wherein each of the MLC physical blocks is mapped to at least two SLC logical blocks. The access method further includes writing data into the MLC physical blocks and reading the data from the MLC physical blocks according to the recorded mapping relationship.

As described above, in the present invention, a MLC NAND flash memory chip can be accessed through a method for accessing a SLC NAND flash memory chip so that a host system supporting only the SLC NAND flash memory chip can also access the MLC NAND flash memory chip.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2:
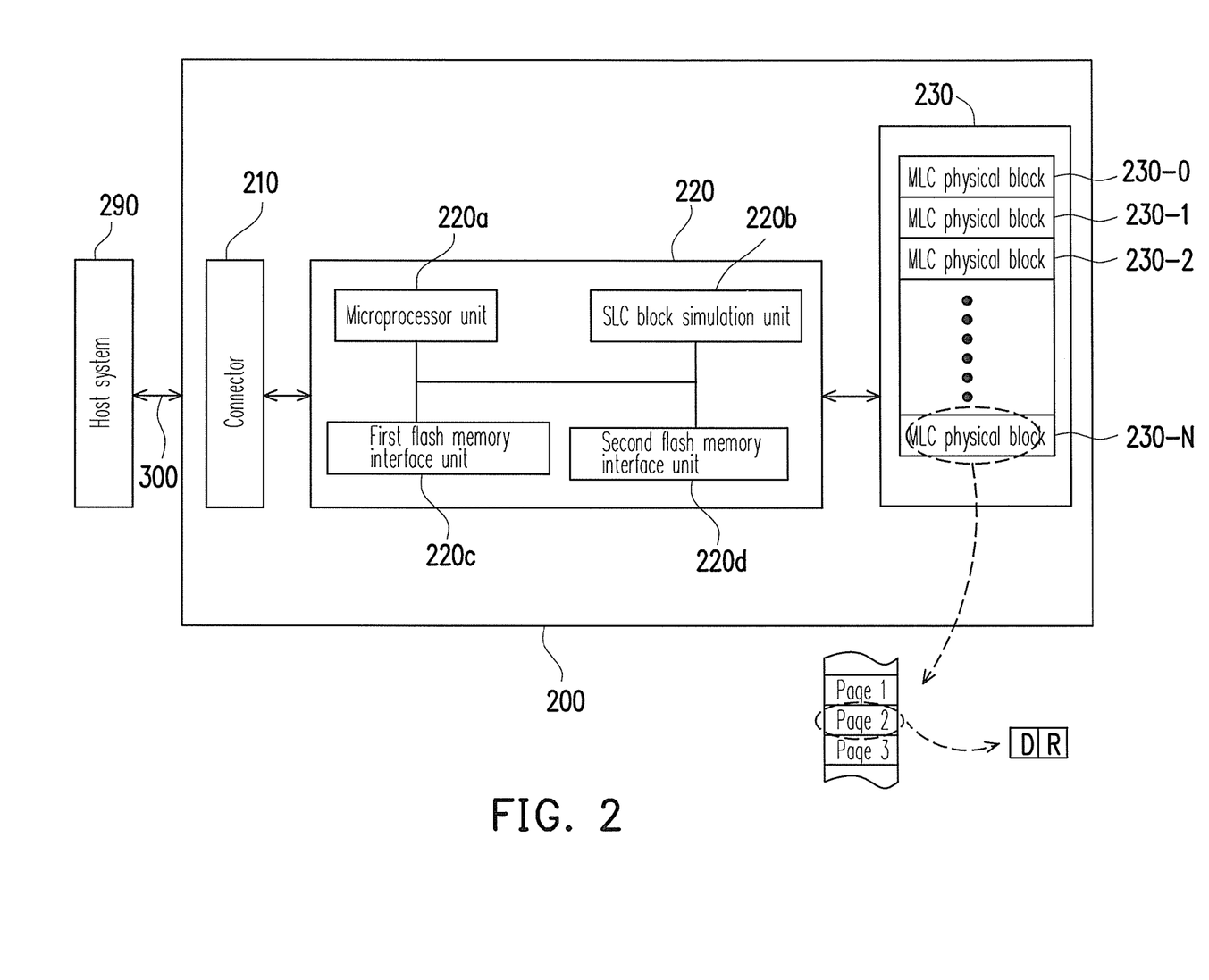
FIG. 2 is a schematic block diagram of a flash memory storage system according to an exemplary embodiment of the present invention.

FIG. 2 is a schematic block diagram of a flash memory storage system according to an exemplary embodiment of the present invention.

Referring to FIG. 2, the flash memory storage system 200 is a storage system which uses a multi level cell (MLC) NAND flash memory for storing data. In particular, the flash memory storage system 200 declares itself a single level cell (SLC) NAND flash memory chip to a host system 290 connected thereto so that the host system 290 can access the flash memory storage system 200 through a method for accessing a SLC NAND flash memory chip. Herein, the host system 290 is an electronic apparatus (for example, a cell phone, a personal digital assistant, or a MP3 player, etc) which uses a NAND flash memory module as its storage medium. In another embodiment of the present invention, the host system 290 further includes a SLC flash memory controller (not shown).

The flash memory storage system 200 includes a connector 210, a flash memory controller 220, and a MLC NAND flash memory chip 230.

The connector 210 is used for connecting the host system 290. In the present exemplary embodiment, the connector 210 is a NAND flash memory interface pin such that the host system 290 can use the flash memory storage system 200 as its storage medium without changing the circuit board thereof. However, the present invention is not limited thereto, and the connector 210 may also be other suitable pins.

The flash memory controller 220 executes a plurality of logic gates or machine instructions implemented as hardware or firmware to perform data writing, reading, and erasing along with the connector 210 and the MLC NAND flash memory chip 230. The flash memory controller 220 includes a microprocessor unit 220a, a SLC block simulation unit 220b, a first flash memory interface unit 220c, and a second flash memory interface unit 220d.

The microprocessor unit 220a cooperates with the SLC block simulation unit 220b, the first flash memory interface unit 220c, and the second flash memory interface unit 220d to execute different commands received from the host system 290.

Figure 6:
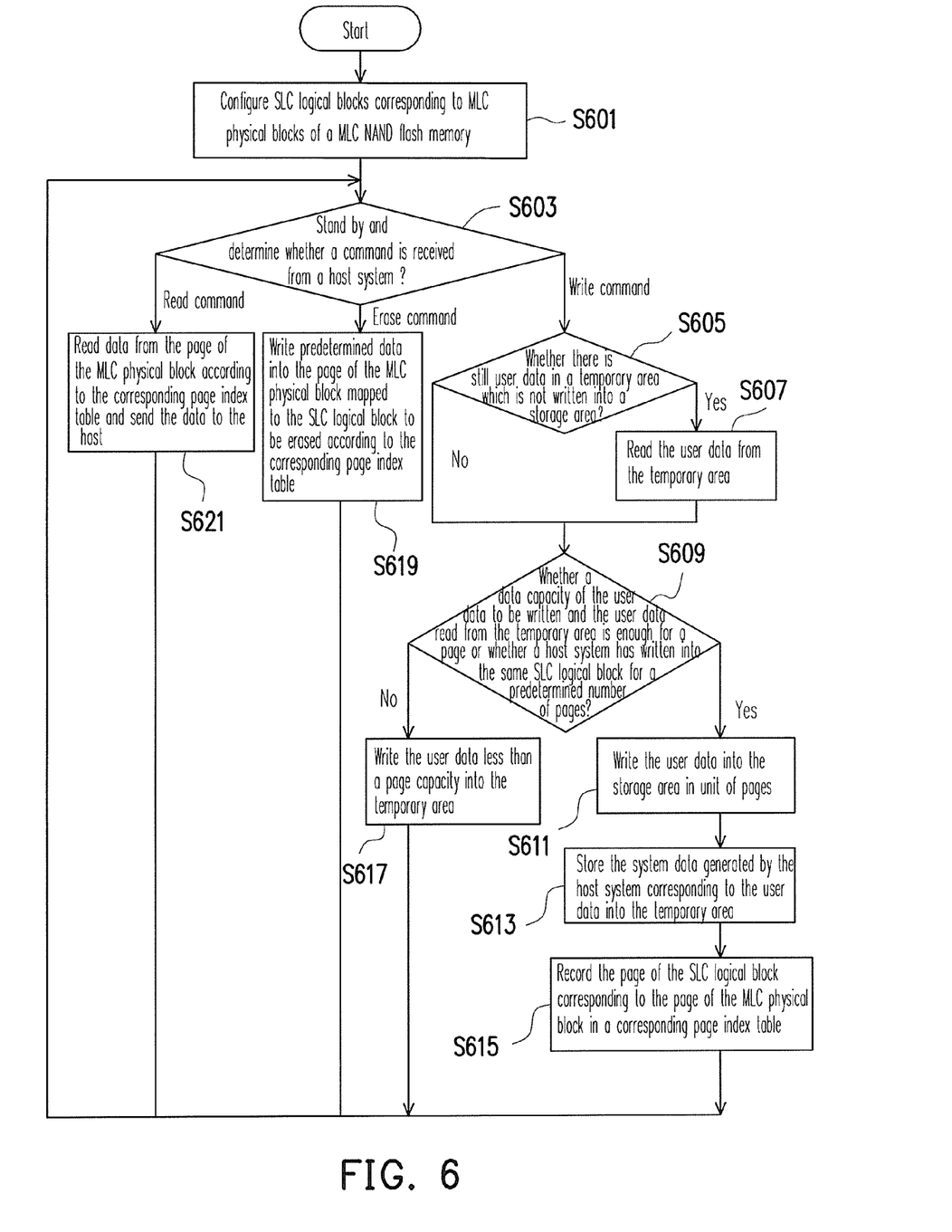
FIG. 6 is a flowchart illustrating how to simulate a MLC NAND flash memory into a single level cell (SLC) NAND flash memory to access the MLC NAND flash memory according to an exemplary embodiment of the present invention.

The SLC block simulation unit 220b is coupled to the microprocessor unit 220a. The SLC block simulation unit 220b may perform the access steps according to the present embodiment (as shown in FIG. 6) such that the flash memory storage system 200 can be simulated into a SLC NAND flash memory chip.

In the present exemplary embodiment, the SLC block simulation unit 220b is implemented in the flash memory controller 220 as a firmware. For example, the SLC block simulation unit 220b may be implemented as related machine instructions written with a programming language and stored in a program memory (for example, a read only memory (ROM)), wherein when the flash memory storage system 200 is in operation, the machine instructions of the SLC block simulation unit 220b are loaded and executed by the microprocessor unit 220a to perform the access steps according to the present embodiment (as shown in FIG. 6).

In another exemplary embodiment of the present invention, the machine instructions of the SLC block simulation unit 220b may also be stored in a specific area (for example, a system area 302) of the MLC NAND flash memory chip 230 as a software. Similarly, when the flash memory storage system 200 is in operation, these machine instructions are loaded and executed by the microprocessor unit 220a. Additionally, in the present exemplary embodiment, the SLC block simulation unit 220b is implemented in the flash memory controller 220 as a plurality of logic gates to perform following operations to the MLC NAND flash memory chip 230. In another embodiment of the present invention, the flash memory controller 220 of the flash memory storage system 200 has a first flash memory interface unit 220c and a second flash memory interface unit 220d. The first flash memory interface unit 220c is used for electrically connecting an external device (for example, a host), and the second flash memory interface unit 220d is used for electrically connecting the MLC NAND flash memory chip 230, wherein both the first flash memory interface unit 220c and the second flash memory interface unit 220d support a flash memory interface signal. The flash memory interface signal includes a chip enable signal/CE, a command latch signal/CLE, an address latch signal/ALE, a data read control signal/RE, a data write control signal/WE, a write protection signal/WP, a chip state signal R/B, and a plurality of data input/output signals IO. The flash memory controller 220 and the MLC NAND flash memory chip 230 are packaged in a single chip according to a land grid array (LGA) packaging standard, a thin small out-line packaging (TSOP) standard, or a chip on board (COB) packaging standard.

The first flash memory interface unit 220c is coupled to the microprocessor unit 220a for receiving commands and data from the host system 290. To be specific, the data and commands received by the flash memory storage system 200 via the connector 210 are identified by the first flash memory interface unit 220c.

The second flash memory interface unit 220d is coupled to the microprocessor unit 220a for accessing the MLC NAND flash memory chip 230. Namely, data to be written by the host system 290 into the MLC NAND flash memory chip 230 is transformed by the second flash memory interface unit 220d into a format acceptable to the MLC NAND flash memory chip 230.

In addition, even though not shown in the present embodiment, the flash memory controller 220 may further include a buffer memory (not shown) for temporarily storing data, an error checking and correcting module (not shown) for generating an error checking and correcting (ECC) code and performing an error checking and correcting procedure, and a power management module (not shown) for managing a power supply of the flash memory storage system 200.

The MLC NAND flash memory chip 230 is used for storing data, and each memory cell thereof can store a plurality of data bits. In the present exemplary embodiment, the MLC NAND flash memory chip 230 is a two level cell NAND flash memory (i.e., each memory cell stores two data bits).

The MLC NAND flash memory chip 230 has a plurality of MLC physical blocks 230-0~230-N. Generally speaking, data in a flash memory is eased in unit of physical blocks. Namely, each physical block contains the least memory cells which are eased together. In the present embodiment, each of the MLC physical blocks 230-0~230-N has 128 pages, wherein each of the pages is served as the smallest unit for programming data, namely, each page is the smallest unit for writing or reading data. Each page has a user data area D and a redundant area R. The user data area D is used for storing user data, and the redundant area R is used for storing system data (for example, an ECC code and logical page addresses mapped to physical page addresses, etc). In the present exemplary embodiment, the user data area D has 512 bytes, and the redundant area R has 16 bytes.

Additionally, in another embodiment of the present invention, the MLC physical blocks 230-0~230-N can be grouped into a plurality of zones. By managing operations of the MLC physical blocks 230-0~230-N based on these zones, parallelism of the operations can be increased and the management thereof can be simplified.

Figure 3A:
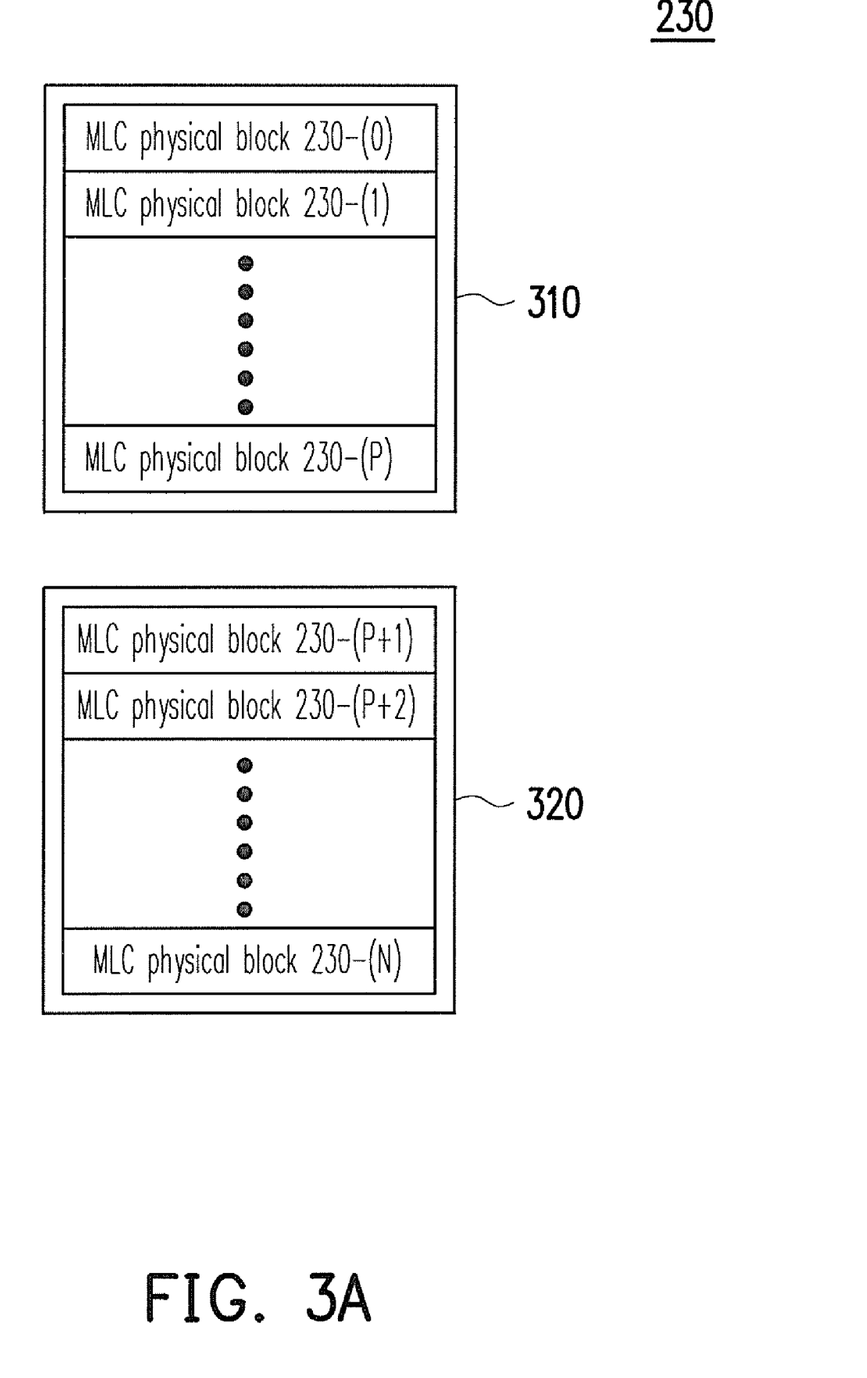
FIGS. 3A~3C are diagrams of a MLC NAND flash memory according to an exemplary embodiment of the present invention.
Figure 3B:
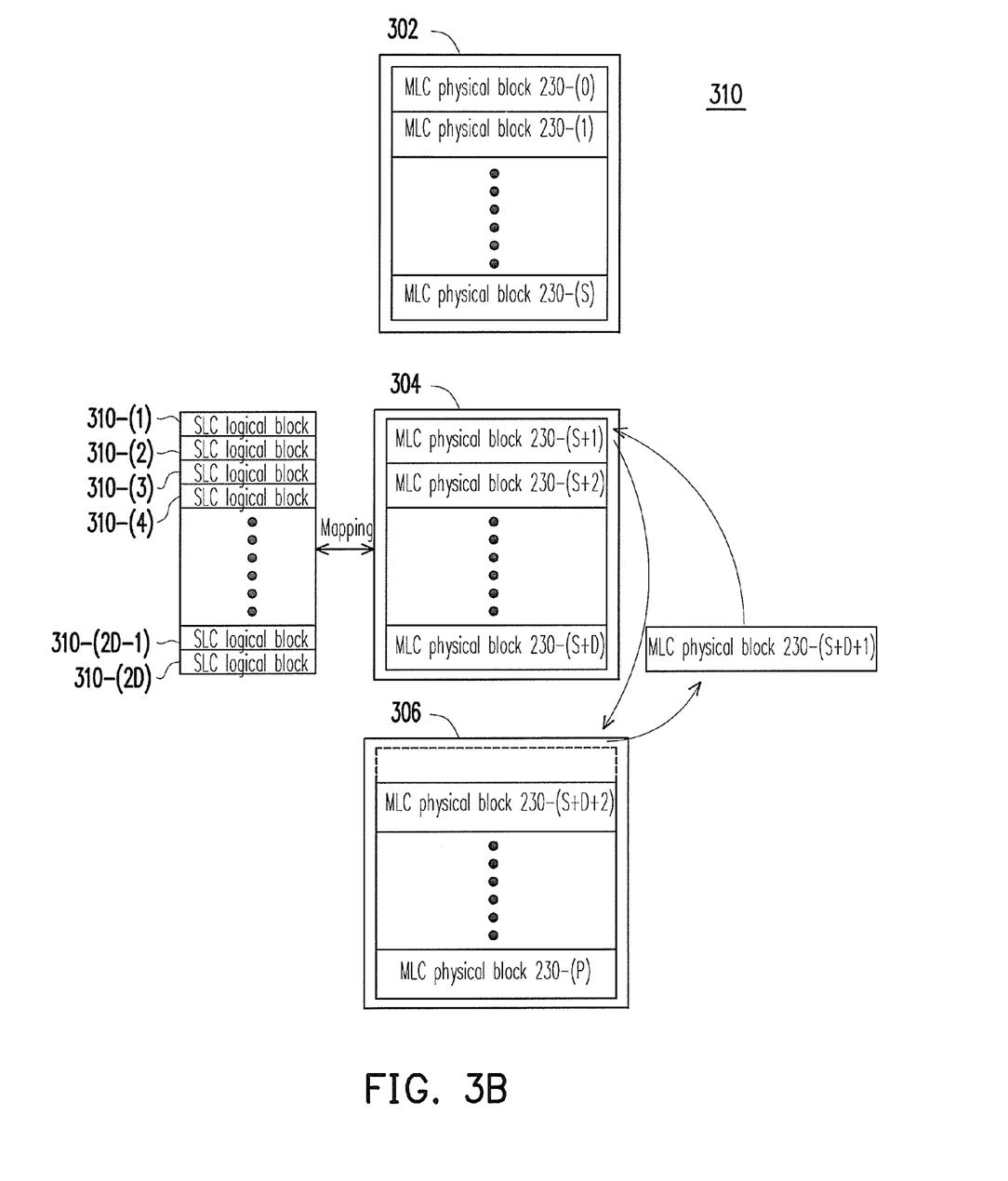
Figure 3C:
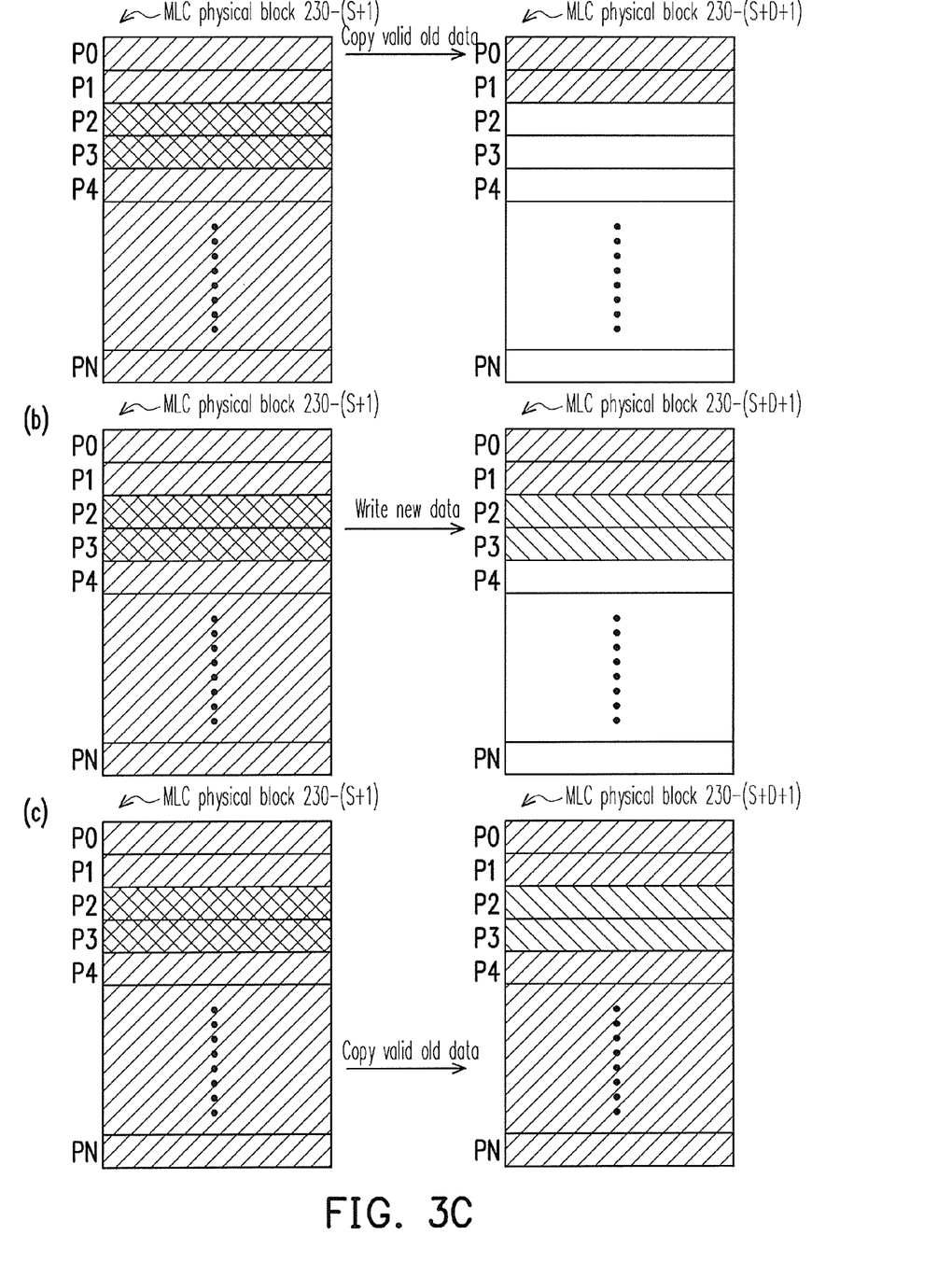

FIGS. 3A~3C are diagrams illustrating the operations of a MLC NAND flash memory according to an embodiment of the present invention.

It should be understood that the terms like "select", "link", "exchange", "divide", "group" used herein for describing the operations of the MLC physical blocks 230-0~230-N in the MLC NAND flash memory chip 230 only refer to logical operations. In other words, the actual positions of the MLC physical blocks 230-0~230-N are not changed; instead, the MLC physical blocks 230-0~230-N are only operated logically. It should be mentioned that following operations of the MLC physical blocks are accomplished by the microprocessor unit 220a of the flash memory controller 220 through execution of the machine instructions of the SLC block simulation unit 220b.

Referring to FIG. 3A, in the present embodiment, the flash memory controller 220 logically groups the MLC physical blocks 230-1~230-N of the MLC NAND flash memory chip 230 into a storage area 310 and a temporary area 320.

The MLC physical blocks (i.e., the MLC physical blocks 230-(0)~230-(P)) in the storage area 310 are used for storing data received from the host system 290. It should be mentioned that because each address in a flash memory can only be programmed once, data at an address has to be erased before new data can be written into this address. However, as described above, data is written into a flash memory in unit of pages. Accordingly, the writing unit is smaller than the erasing unit (physical blocks). Thus, to erase a physical block, valid data in the pages of the physical block has to be copied into another physical block before the physical block is erased.

FIG. 3B is a diagram illustrating the operations of the storage area 310 in FIG. 3A.

Referring to FIG. 3A, the flash memory controller 220 logically groups the MLC physical blocks in the storage area 310 into a system area 302, a data area 304, and a spare area 306.

The MLC physical blocks (i.e., the MLC physical blocks 230-(0)~230-(S)) in the system area 302 are used for recording system data, such as a number of zones, a number of MLC physical blocks in each zone, a number of pages in each MLC physical block of the MLC NAND flash memory chip 230.

The MLC physical blocks (i.e., the MLC physical blocks 230-(S+1)~230-(S+D)) in the data area 304 are used for storing user data written by the host system 290.

The MLC physical blocks (i.e., the MLC physical blocks 230-(S+D+1)~230-(P)) in the spare area 306 are used for substituting the MLC physical blocks in the data area 304. Accordingly, the physical blocks in the spare area 306 may be blank or available blocks, namely, no data is recorded therein or data recorded therein is marked as invalid data.

To be specific, when the flash memory storage system 200 receives a write command from the host system 290 and accordingly is about to write data into a MLC physical block in the data area 304, the flash memory controller 220 selects a MLC physical block from the spare area 306, writes the valid old data in the MLC physical block in the data area 304 and the new data together into the MLC physical block selected from the spare area 306, and then links the MLC physical block containing the new data to the data area 304. After that, the flash memory controller 220 erases the original MLC physical block in the data area 304 and links it to the spare area 306.

In order to allow the host system 290 to access the MLC physical blocks used alternatively for storing data, the flash memory controller 220 provides the number of MLC physical blocks in the data area 304 to the host system 290 such that the host system 290 can manage the logical blocks 310-(1)~310-(2D). Namely, the flash memory controller 220 records and updates a mapping relationship between the logical blocks and the MLC physical blocks in the data area 304 in a logical-physical address mapping table to reflect the alternation of the MLC physical blocks. Accordingly, the host system 290 needs only to write data into the logical block while the flash memory controller 220 performs data erasing, reading, or writing to the mapped MLC physical block according to the logical-physical address mapping table. Particularly, in the present embodiment, the flash memory controller 220 provides the SLC logical blocks 310-(1)~310-(2D) to the host system 290 such that the host system 290 can access the flash memory storage system 200 through a method for accessing the SLC NAND flash memory, wherein each MLC physical block in the MLC NAND flash memory chip 230 is simulated into two SLC logical blocks. It should be noted that in the present embodiment, the logical blocks or physical blocks are defined from the viewpoint of the flash memory controller 220 in the flash memory storage system 200. Namely, the block addresses transmitted from the host system 290 to the flash memory controller 220 are considered logical addresses, while the block addresses used by the flash memory controller 220 for actually storing data are considered physical addresses.

It should be mentioned that because the MLC NAND flash memory chip 230 is a two level cell NAND flash memory chip, each MLC physical block is mapped to two SLC logical blocks. However, the present invention is not limited thereto, and the number of SLC logical blocks can be mapped to each MLC physical block may vary along with the number of levels of memory cells in the MLC NAND flash memory chip.

FIG. 3C is a diagram illustrating how a write command is executed to the MLC physical block in FIG. 3B according to an embodiment of the present invention.

Referring to FIG. 3C, for example, when the host system 290 is about to write a user data into the SLC logical block 310-1, the flash memory controller 220 determines that the SLC logical block 310-1 is currently mapped to the MLC physical block 230-(S+1) in the data area 304 according to the logical-physical address mapping table. The flash memory controller 220 then updates the data in the MLC physical block 230-(S+1). To be specific, the flash memory controller 220 selects the MLC physical block 230-(S+D+1) from the spare area 306 for substituting the MLC physical block 230-(S+1) in the data area 304. However, when the new data is written into the MLC physical block 230-(S+D+1), not all the valid data in the MLC physical block 230-(S+1) is instantly moved to the MLC physical block 230-(S+D+1) to erase the MLC physical block 230-(S+1). For example, the flash memory controller 220 copies the valid data (i.e., the pages P0 and P1) before the page to be written in the MLC physical block 230-(S+1) into the MLC physical block 230-(S+D+1) (as shown in FIG. 3C(a)) and writes the new data into the MLC physical block 230-(S+D+1) (as the pages P2 and P3 in the MLC physical block 230-(S+D+1) in FIG. 3C(b)). The MLC physical block 230-(S+D+1) containing part of the valid old data and the new data is temporarily linked as a substitute MLC physical block. This is because the valid data in the MLC physical block 230-(S+1) may become invalid during a next operation (for example, a write command) so that instantly moving all the valid data in the MLC physical block 230-(S+1) to the substitute MLC physical block 230-(S+D+1) may become meaningless. In the present example, the integrated content of the valid data in the MLC physical block 230-(S+1) related to the SLC logical block 310-1 and the valid data in the substitute MLC physical block 230-(S+D+1) related to the SLC logical block 310-1 is the complete content of the SLC logical block 310-1. Such a temporary mother-child relationship (i.e., the relationship between the MLC physical block 230-(S+1) and the substitute MLC physical block 230-(S+D+1)) can be determined according to the resources of the flash memory controller 220 (for example, the size of a buffer memory), and the operation for temporarily maintaining such a temporary relationship is usually referred to as opening mother-child blocks. In the present embodiment, at most 5 sets of mother-child blocks can be opened.

The flash memory controller 220 combines the MLC physical block 230-(S+1) and the substitute MLC physical block 230-(S+D+1) into a single MLC physical block only when the contents of the MLC physical block 230-(S+1) and the substitute MLC physical block 230-(S+D+1) need to be actually integrated, so that the efficiency in using these blocks can be improved. The integration operation is also referred to as closing mother-child blocks. For example, as shown in FIG. 3C(c), while closing the mother-child blocks, the flash memory controller 220 copies the remaining valid data (i.e., the pages P4~PN) in the MLC physical block 230-(S+1) to the substitute MLC physical block 230-(S+D+1) and then erases the MLC physical block 230-(S+1) and links it to the spare area 306. Meanwhile, the flash memory controller 220 links the substitute MLC physical block 230-(S+D+1) to the data area 304 and updates the mapping of the logical block 310-1 to the MLC physical block 230-(S+D+1) in the logical-physical address mapping table, so as to close the mother-child blocks.

It has to be understood that foregoing method for moving data to open and close the mother-child blocks is not intended for limiting the present invention. For example, in another embodiment of the present invention, similar to the process described above for updating the data in the MLC physical block 230-(S+1), a process for opening mother-child blocks is executed to select the MLC physical block 230-(S+D+1) and write the new data to be written into the pages P2~P3 of the MLC physical block 230-(S+1) directly into the pages P0~P1 of the MLC physical block 230-(S+1). When the contents in the parent and child blocks need to be combined, the valid data in the pages P4~PN and the pages P0~P1 in the MLC physical block 230-(S+1) is sequentially written into the pages P2~PN of the MLC physical block 230-(S+D+1), and the MLC physical block 230-(S+1) is erased.

Since in the present embodiment, each MLC physical block is mapped to two SLC logical blocks, when the flash memory controller 220 updates the logical-physical address mapping table, the flash memory controller 220 updates the mapping relationship of the mapped two SLC logical blocks at the same time. For example, in foregoing example, when the MLC physical block 230-(S+D+1) is used for substituting the MLC physical block 230-(S+1), the flash memory controller 220 updates the mapping of the SLC logical blocks 310-1 and 310-2 to the MLC physical block 230-(S+D+1) at the same time.

In addition, data is sequentially written into each MLC physical block of the MLC NAND flash memory chip 230 in unit of pages. Thus, in order to allow the host system 290 to write data alternatively into two SLC logical blocks mapped to one MLC physical block, the flash memory controller 220 records the page of the SLC logical blocks mapped to each page of the MLC physical block for writing the data.

For example, the flash memory controller 220 establishes a page index table for each MLC physical block to record the mapping relationship of each page therein. In an exemplary embodiment of the present invention, the flash memory controller 220 stores the page index table in either a MLC physical block of the system area 302 or a buffer memory (not shown), or in both of the two.

Figure 4:
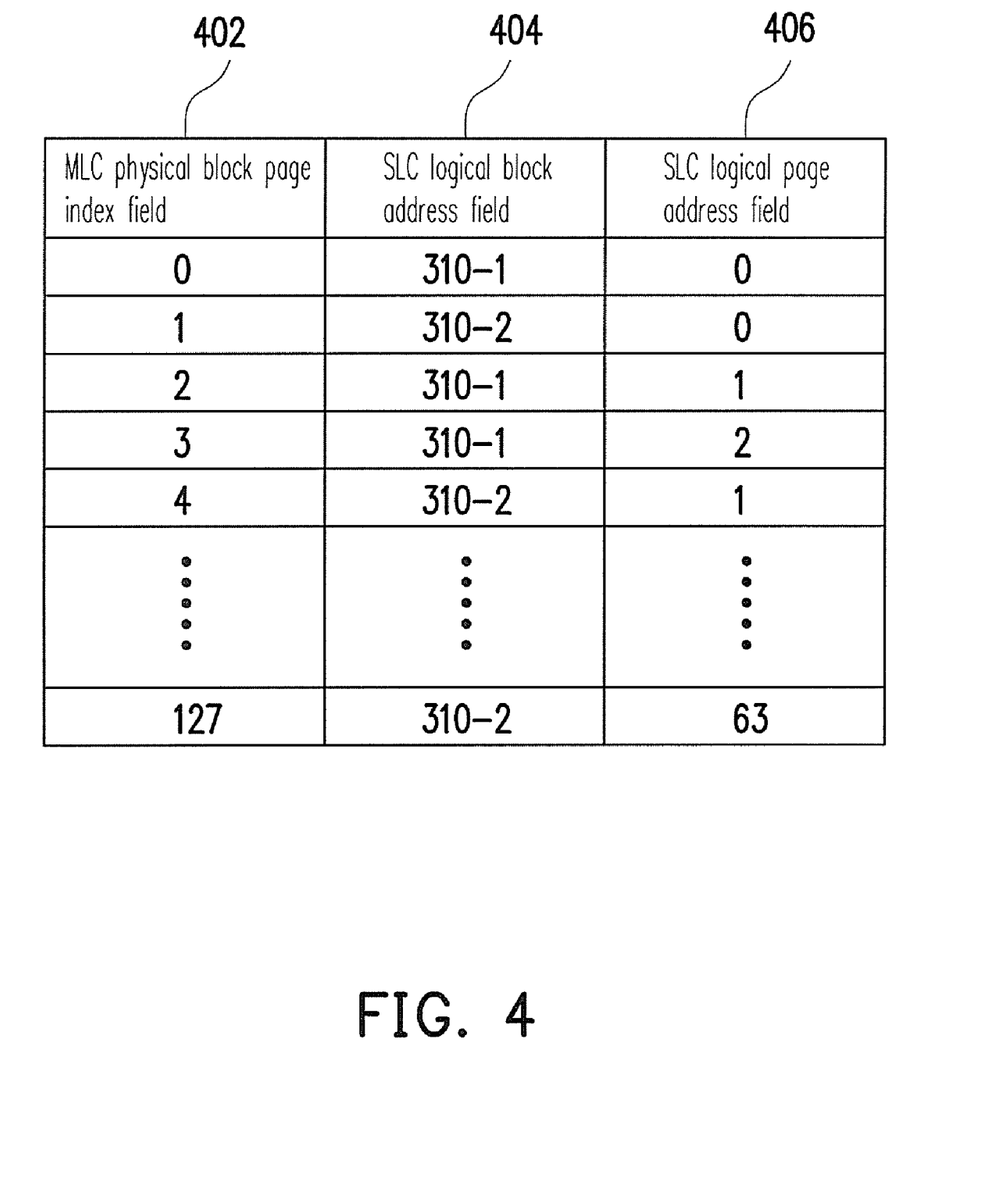
FIG. 4 illustrates an example of a page index table according to an exemplary embodiment of the present invention.

FIG. 4 illustrates an example of a page index table according to an exemplary embodiment of the present invention.

Referring to FIG. 4, the page index table of the MLC physical block 230-(S+1) includes a MLC physical page index field 402, a SLC logical block address field 404, and a SLC logical page address field 406. The SLC logical block address field 404 and the SLC logical page address field 406 respectively record the SLC logical blocks corresponding to the page addresses recorded in the MLC physical page index field 402 and the logical page addresses thereof. For example, the $0^{th}$ page in the MLC physical block 230-(S+1) is mapped to the $0^{th}$ page in the SLC logical block 310-1, the $1^{st}$ page in the MLC physical block 230-(S+1) is mapped to the $0^{th}$ page in the SLC logical block 310-2, the $2^{nd}$ page in the MLC physical block 230-(S+1) is mapped to the $1^{st}$ page in the SLC logical block 310-1, the $3^{rd}$ page in the MLC physical block 230-(S+1) is mapped to the $2^{nd}$ page in the SLC logical block 310-1, the $4^{th}$ page in the MLC physical block 230-(S+1) is mapped to the $1^{st}$ page in the SLC logical block 310-2 . . . . Thus, when the host system 290 writes data alternatively to page addresses in the SLC logical blocks 310-1 and 310-2, the flash memory controller 220 still writes data sequentially into the pages in the MLC physical block 230-(S+1) and determines the page in the SLC logical blocks 310-1 and 310-2 mapped to each page in the MLC physical block 230-(S+1) according to the page index table.

It should be mentioned that as described above, data in the MLC NAND flash memory chip 230 is erased in unit of MLC physical blocks. Accordingly when the host system 290 is about to execute an erase command to a SLC logical block (for example, the SLC logical block 310-1), since each MLC physical block (for example, the MLC physical block 230-(S+1)) is mapped to multiple SLC logical blocks (for example, the SLC logical block 310-1 and the SLC logical block 310-2), in the present embodiment, the flash memory controller 220 does not execute the erase command directly to the MLC physical block. Instead, the flash memory controller 220 writes a predetermined data having the same pattern as that presented by the erased page into the pages of the SLC logical block to be erased according to the page index table. For example, if each bit in an erased page has a value "1", "1" is written into each bit in the page. Thereby, in the present embodiment, when an erase command is received from the host system 290, the flash memory controller 220 writes "1" to each bit in the pages of the SLC logical block to be erased.

In the exemplary embodiment, the predetermined data is written into the page to be erased when the erase command is executed. However, in another exemplary embodiment, the flash memory controller 220 builds a valid page table to record valid pages in the MLC physical block when the erase command for the MLC physical block is executed, and the flash memory controller 220 erases the MLC physical block by using the erase command when all pages in the MLC physical block have become invalid pages.

Referring to FIG. 3A again, the MLC physical blocks 230-(P+1)~230-(N) in the temporary area 320 are used for temporarily storing data to be written by the host system 290. To be specific, when the host system 290 sends a write command to the flash memory storage system 200 to write a user data, the flash memory controller 220 temporarily stores the user data less than a page capacity into a MLC physical block in the temporary area 320, and the flash memory controller 220 writes the user data temporarily stored in the temporary area 320 and subsequent user data to be written by the host system 290 into the storage area 310 in unit of pages.

Figure 5:
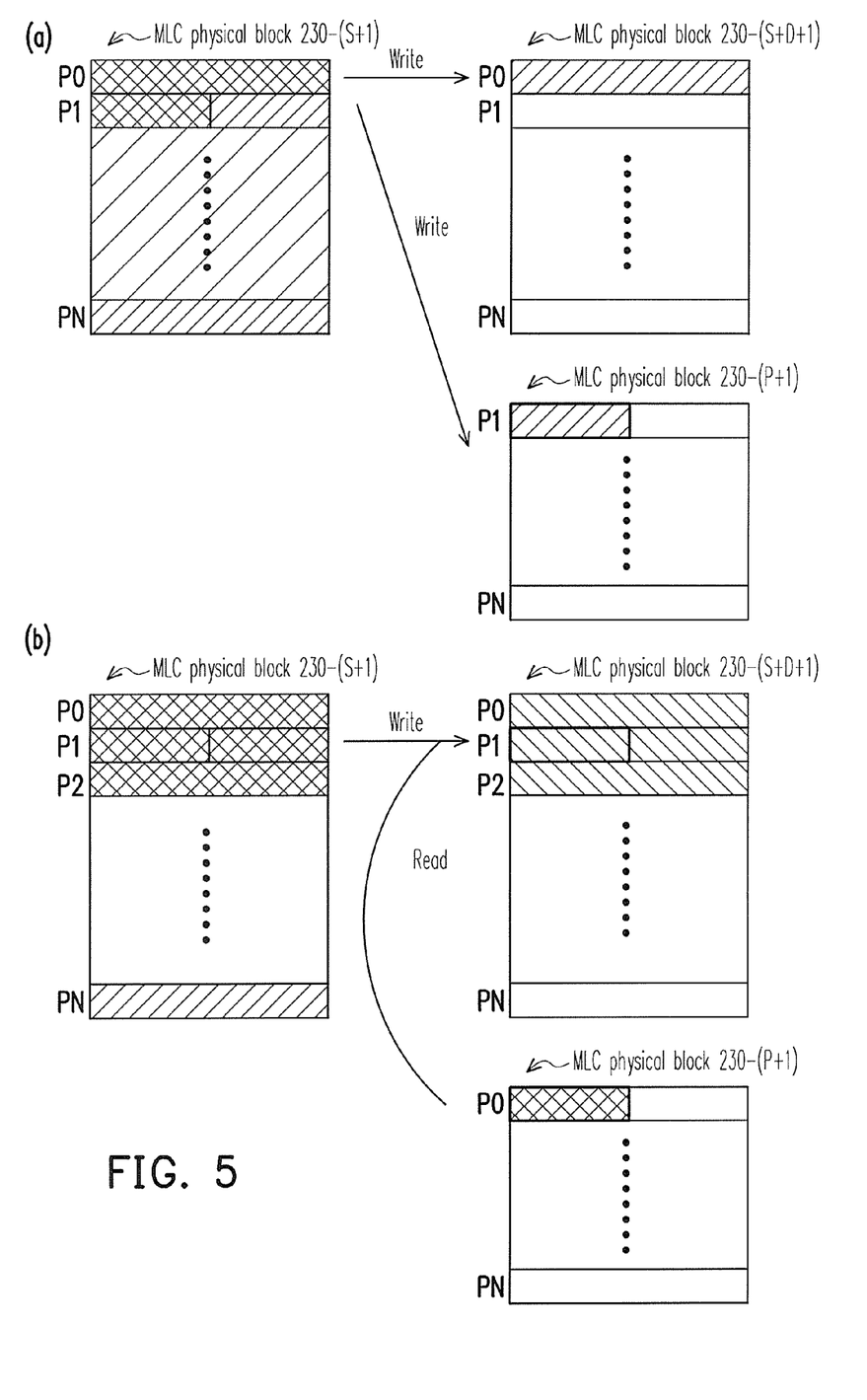
FIG. 5 is a diagram illustrating how to write user data less than a page according to an exemplary embodiment of the present invention.

FIG. 5 is a diagram illustrating how to write user data less than a page according to an exemplary embodiment of the present invention.

For example, when the host system 290 is about to write a user data into the SLC logical block 310-1, the flash memory controller 220 gets to know that currently the SLC logical block 310-1 is mapped to the MLC physical block 230-(S+1) in the data area 304 according to the logical-physical address mapping table. Then, the flash memory controller 220 selects the MLC physical block 230-(S+D+1) from the spare area 306 for substituting the MLC physical block 230-(S+1) and writing the user data. Referring to FIG. 5, when the host system 290 is about to write the user data into the entire page of page P0 and the first half of the page P1, the flash memory controller 220 writes the corresponding user data into the page P0 of the MLC physical block 230-(S+D+1) in the storage area 310 and temporarily stores the user data corresponding to the first half of the page P1 into the MLC physical block 230-(P+1) of the temporary area 320 (as shown in FIG. 5(a)). Subsequently, when the host system 290 writes other user data into the second half of the page P1 and the entire page of the page P2, the flash memory controller 220 reads the user data corresponding to the first half of the page P1 from the MLC physical block 230-(P+1) and writes it together with the user data corresponding to the second half of the page P1 into the page P1 of the MLC physical block 230-(S+D+1). After that, the flash memory controller 220 continues to write corresponding user data into the page P2 of the MLC physical block 230-(S+D+1).

Accordingly, when the host system 290 writes user data less than a page capacity into the MLC NAND flash memory chip 230 through a method for writing data in a SLC NAND flash memory, the flash memory controller 220 writes the MLC NAND flash memory chip 230 in unit of pages.

It should be mentioned that when the host system 290 writes user data into each page of a SLC logical block, the host system 290 generates system data (for example, an ECC code) corresponding to the user data and writes the system data into the redundant area R of the corresponding page. However, the ECC code required by the MLC NAND flash memory chip 230 is different from that required by a SLC NAND flash memory chip. Accordingly, the flash memory controller 220 has to generate a corresponding ECC code when it writes data into a MLC physical block of the MLC NAND flash memory chip 230 and stores the ECC code into the redundant area R of the page in the MLC physical block. As a result, the redundant area R in the page of the MLC physical block does not have sufficient space for storing the ECC code generated by the host system 290 and the ECC code generated by the flash memory controller 220.

In the present embodiment, the flash memory controller 220 stores the system data generated according to characteristics of the MLC NAND flash memory chip 230 into the redundant area of the page in the MLC physical block of the MLC NAND flash memory chip 230 and writes the system data to be written by the host system 290 into the redundant area of the page in the SLC logical block into the temporary area 320, wherein the flash memory controller 220 refers to the system data generated according to the characteristics of the MLC NAND flash memory chip 230 as MLC redundant data and the system data to be written by the host system 290 into the redundant area of the page in the SLC logical block as SLC redundant data. Thus, when the host system 290 reads user data, the flash memory controller 220 manages the accessed user data according to the system data corresponding to the MLC NAND flash memory chip 230 and at the same time, reads the system data original generated by the host system 290 from the temporary area 320 and sends it to the host system 290. In another embodiment of the present invention, the flash memory controller 220 may also edit or partition the user data, the SLC redundant data, and the MLC redundant data corresponding to each SLC logical block and stores a part of the edited data into the storage area 310 and another part of the edited data into the temporary area 320, wherein a mapping table is established for recording the address of the MLC physical block mapped to each SLC logical block. For example, the SLC redundant data to be written by the host system 290 into the redundant area of the page in the SLC logical block is written into the redundant area of the page in the MLC physical block of the MLC NAND flash memory chip 230, and the MLC redundant data generated according to the characteristics of the MLC NAND flash memory chip 230 is written into the temporary area 320. When the host system 290 is about to read data corresponding to a specific SLC logical block, the flash memory controller 220 recomposes the user data, the SLC redundant data, and the MLC redundant data corresponding to the specific SLC logical block according to the established mapping table and then performs the corresponding operation (for example, an error checking and correcting procedure for the MLC NAND flash memory chip 230) and sends the processed user data and SLC redundant data to the host system 290.

FIG. 6 is a flowchart illustrating how to simulate a MLC NAND flash memory into a SLC NAND flash memory to access the MLC NAND flash memory according to an exemplary embodiment of the present invention.

Referring to FIG. 6, in the process 600, first, SLC logical blocks mapped to the MLC physical blocks in the MLC NAND flash memory chip 230 are configured (step S601).

Then, in step S603, a command is received from the host system 290. If a write command is received in step S603, whether there is user data in the temporary area 320 which is not yet written into the storage area 310 is determined in step S605. If there is still user data not written into the storage area 310 in the temporary area 320, in step S607, the user data is read from the temporary area 320. After that, in step S609, whether the data quantity of the user data to be written and the user data read from the temporary area reaches a page capacity or whether the host system 290 has written into the same page of the SLC logical block for a predetermined number of times is determined, wherein the predetermined number is set to 4 since a SLC NAND flash memory having each of its pages to be programmed 4 times is simulated in the present embodiment.

If it is determined in step S609 that the data quantity of the user data to be written and the user data read from the temporary area 320 can fill up an entire page or the host system 290 has already written the same page of the SLC logical block for the predetermined number of times, in step S611, the user data is written into the storage area 320 in unit of pages, wherein the user data contains the user data read from the temporary area 320 and the user data to be written by the current write command. Thereafter, in step S613, the system data corresponding to the user data generated by the host system 290 is stored into the temporary area 320. In step S615, the page of the SLC logical block mapped to the page of the MLC physical block for writing the user data is recorded into the corresponding page index table.

If it is determined in step S609 that the data quantity of the user data to be written and the user data read from the temporary area is not enough to fill up an entire page and the host system 290 has not written the same page of the SLC logical block for the predetermined number of times, the user data less than a page capacity is then written into the temporary area 320 in step S617.

If an erase command is received in step S603, in step S619, a predetermined data is written into the page in the MLC physical block mapped to the SLC logical block to be erased according to the corresponding page index table, wherein the predetermined data has the same pattern as that presented by the erased page.

If a read command is received in step S603, in step S621, data is read from the corresponding page of the MLC physical block according to the corresponding page index table and sent to the host system 290.

Thereafter, the process 600 returns to step S603 to wait for the next command, and the process 600 is terminated when the flash memory storage system is powered off.

Additionally, the execution order of the steps in FIG. 6 is not limited in the present invention, and these steps may be executed in different orders by those skilled in the art without departing from the spirit and scope of the present invention.

As described above, in the present invention, when the host system is about to execute a write command, the flash memory controller records the page of SLC logical block mapped to each page of the MLC physical block so that each physical block in the MLC NAND flash memory can be simulated as a plurality of SLC logical blocks. Moreover, in the present invention, when the host system is about to execute an erase command, the flash memory controller writes a predetermined data into the page of the MLC physical block mapped to the SLC logical block to be erased so that valid user data of other SLC logical blocks will not be lost by directly erasing the MLC physical block wherein the predetermined data has the same pattern as that presented by the erased page. Furthermore, in the present invention, a temporary area is configured in the MLC NAND flash memory for temporarily storing user data less than a page capacity and system data (i.e., the data in the redundant area) required by the SLC NAND flash memory, such that the MLC NAND flash memory can be simulated into a SLC NAND flash memory.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multi level cell (MLC) NAND flash memory storage system, for simulating a single level cell (SLC) NAND flash memory chip, the MLC NAND flash memory storage system comprising:
    a connector, for connecting a host system;
    a MLC NAND flash memory chip, having a plurality of MLC physical blocks, wherein each of the MLC physical blocks has a plurality of pages; and
    a flash memory controller, coupled to the MLC NAND flash memory chip and the connector, for providing a plurality of SLC logical blocks corresponding to the SLC NAND flash memory chip to the host system, wherein each of the MLC physical blocks is mapped to at least two of the SLC logical blocks.

2. The MLC NAND flash memory storage system according to claim 1, wherein when the flash memory controller receives a write command and first user data from the host system, the flash memory controller writes the first user data into the pages of the MLC physical blocks and records pages of the SLC logical blocks mapped to the pages of the MLC physical blocks for writing the first user data.

3. The MLC NAND flash memory storage system according to claim 2, wherein the flash memory controller records the pages of the SLC logical blocks mapped to the pages of the MLC physical blocks for writing the first user data in a page index table.

4. The MLC NAND flash memory storage system according to claim 2, wherein the flash memory controller groups the MLC physical blocks into at least a storage area and a temporary area, and
wherein when the flash memory controller receives the write command and the first user data from the host system, the flash memory controller writes the first user data less than a page capacity into the temporary area.

5. The MLC NAND flash memory storage system according to claim 4, wherein when the flash memory controller determines that a data quantity of the first user data stored in the temporary area and a second user data to subsequently be written exceeds a page capacity or the pages of the SLC logical blocks mapped to the pages of the MLC physical blocks for writing the first user data and the second user data has been written by the host system for a predetermined number of times, the flash memory controller writes the first user data stored in the temporary area and the second user data together into the storage area in unit of pages.

6. The MLC NAND flash memory storage system according to claim 4, wherein when the flash memory controller receives the write command and the first user data from the host system, the flash memory controller writes the first user data and a part of first redundant data and second redundant data corresponding to the first user data into the storage area and writes the first user data and another part of the first redundant data and the second redundant data corresponding to the first user data into the temporary area, wherein the first redundant data is system data corresponding to the first user data, and the second redundant data is generated by the flash memory controller according to the first user data and the first redundant data.

7. The MLC NAND flash memory storage system according to claim 6, wherein the first redundant data and the second redundant data respectively comprise an error checking and correcting (ECC) code.

8. The MLC NAND flash memory storage system according to claim 1, wherein when the flash memory controller receives an erase command from the host system, the flash memory controller writes predetermined data into the pages of the MLC physical blocks to be erased, wherein the predetermined data has a pattern which is the same as a pattern of the erased pages.

9. The MLC NAND flash memory storage system according to claim 1, wherein when the flash memory controller receives an erase command from the host system, the flash memory controller marks the pages of the MLC physical blocks to be erased as invalid pages, and the flash memory controller erases the corresponding MLC physical block when all the pages in the corresponding MLC physical block have become the invalids pages.

10. A flash memory controller, suitable for simulating a MLC NAND flash memory chip into a SLC NAND flash memory chip, wherein the MLC NAND flash memory chip has a plurality of MLC physical blocks and each of the MLC physical blocks has a plurality of pages, the flash memory controller comprising:
a microprocessor unit, coupled to a first flash memory interface unit and a second flash memory interface unit;
a SLC block simulation unit, coupled to the microprocessor unit, for providing a plurality of SLC logical blocks corresponding to the SLC NAND flash memory chip to a host system, wherein each of the MLC physical blocks is mapped to at least two of the SLC logical blocks;
a first flash memory interface unit, coupled to the microprocessor unit, for receiving a logical address and a command corresponding to the SLC logical blocks from the host system and providing the logical address and the command to the microprocessor unit; and
a second flash memory interface unit, coupled to the microprocessor unit, for electrically connecting the MLC NAND flash memory.

11. The flash memory controller according to claim 10, wherein when the microprocessor unit receives a write command and first user data from the host system, the SLC block simulation unit writes the first user data into the pages of the MLC physical blocks and records pages of the SLC logical blocks mapped to the pages of the MLC physical blocks for writing the first user data.

12. The flash memory controller according to claim 11, wherein the SLC block simulation unit records the pages of the SLC logical blocks mapped to the pages of the MLC physical blocks for writing the first user data in a page index table.

13. The flash memory controller according to claim 12, wherein the SLC block simulation unit groups the MLC physical blocks into at least a system area, and wherein the SLC block simulation unit stores the page index table in the system area.

14. The flash memory controller according to claim 12, wherein the flash memory interface signal comprises a chip enable signal/CE, a command latch signal/CLE, an address latch signal/ALE, a data read control signal/RE, a data write control signal/WE, a write protection signal/WP, a chip state signal R/B, and a plurality of data input/output signals TO.

15. The flash memory controller according to claim 11, wherein the SLC block simulation unit groups the MLC physical blocks into at least a storage area and a temporary area, and
wherein when the microprocessor unit receives the write command and the first user data from the host system, the SLC block simulation unit writes the first user data less than a page capacity into the temporary area.

16. The flash memory controller according to claim 15, wherein when the SLC block simulation unit determines that a data quantity of the first user data stored in the temporary area and a second user data to subsequently be written exceeds a page capacity or the pages of the SLC logical blocks mapped to the pages of the MLC physical blocks for writing the first user data and the second user data has been written by the host system for a determined number of times, the SLC block simulation unit writes the first user data stored in the temporary area and the second user data together into the storage area in unit of pages.

17. The flash memory controller according to claim 15, wherein when the microprocessor unit receives the write command and the first user data from the host system, the SLC block simulation unit writes the first user data and a part of first redundant data and second redundant data corresponding to the first user data into the storage area and writes the first user data and another part of the first redundant data and the second redundant data corresponding to the first user data into the temporary area, wherein the first redundant data is system data corresponding to the first user data, and the second redundant data is generated by the flash memory controller according to the first user data and the first redundant data.

18. The flash memory controller according to claim 17, wherein the first redundant data and the second redundant data respectively comprise an ECC code.

19. The flash memory controller according to claim 17, wherein when the microprocessor unit receives the write command and the first user data from the host system, the SLC block simulation unit writes the first redundant data corresponding to the first user data into the temporary area.

20. The flash memory controller according to claim 10, wherein when the microprocessor unit receives an erase command from the host system, the SLC block simulation unit writes predetermined data into the pages of the MLC physical blocks to be erased, wherein the predetermined data has a pattern which is the same as a pattern of the erased pages.

21. The flash memory controller according to claim 10, wherein when the microprocessor unit receives an erase command from the host system, the SLC block simulation unit marks the pages of the MLC physical blocks to be erased as invalid pages, and the SLC block simulation unit erases the corresponding MLC physical block when all the pages in the corresponding MLC physical block have become the invalids pages.

22. The flash memory controller according to claim 10, wherein the first flash memory interface unit and the second flash memory interface unit both support a flash memory interface signal.

23. An access method, for simulating a MLC NAND flash memory chip into a SLC NAND flash memory chip, the access method comprising:
    providing the MLC NAND flash memory chip, wherein the MLC NAND flash memory chip has a plurality of MLC physical blocks and each of the MLC physical blocks has a plurality of pages;
    disposing a plurality of SLC logical blocks;
    recording a mapping relationship between the MLC physical blocks and the SLC logical blocks, wherein each of the MLC physical blocks is mapped to at least two of the SLC logical blocks; and
    writing data into the MLC physical blocks and reading the data from the MLC physical blocks according to the mapping relationship.

24. The access method according to claim 23, further comprising:
    when a write command and first user data are received, writing the first user data into pages of the MLC physical blocks and recording pages of the SLC logical blocks mapped to the pages of the MLC physical blocks for writing the first user data.

25. The access method according to claim 23, further comprising:
    when an erase command is received, writing predetermined data into the pages of the MLC physical blocks to be erased, wherein the predetermined data has a pattern which is the same as a pattern of the erased the pages.

26. The access method according to claim 23, further comprising:
    when an erase command is received, marking the pages of the MLC physical blocks to be erased as invalid pages, and erasing the corresponding MLC physical block when all the pages in the corresponding MLC physical block have become the invalids pages.

27. The access method according to claim 23, further comprising:
    recording the pages of the SLC logical blocks mapped to the pages of the MLC physical blocks for writing the first user data into a page index table.

28. The access method according to claim 27, further comprising:
    grouping the MLC physical blocks into at least a system area; and
    storing the page index table in the system area.

29. The access method according to claim 23, further comprising:
    grouping the MLC physical blocks into at least a storage area and temporary area; and
    when the write command and the first user data are received, writing the first user data less than a page capacity into the temporary area.

30. The access method according to claim 29, further comprising:
    when it is determined that a data quantity of the first user data stored in the temporary area and a second user data to subsequently be written exceeds a page capacity or the pages of the SLC logical blocks mapped to the pages of the MLC physical blocks for writing the first user data and the second user data has been written by the host system for a predetermined number of times, writing the first user data stored in the temporary area and the second user data together into the storage area in unit of pages.

31. The access method according to claim 29, further comprising:
    when the write command and the first user data are received, writing the first user data and a part of first redundant data and second redundant data corresponding to the first user data into the storage area, and writing the first user data and another part of the first redundant data and the second redundant data corresponding to the first user data into the temporary area, wherein the first redundant data is system data corresponding to the first user data, and the second redundant data is generated according to the first user data and the first redundant data.

32. The access method according to claim 31, further comprising:
    when the write command and the first user data are received, writing the first redundant data corresponding to the first user data into the temporary area.

* * * * *